(12) United States Patent
Amoh et al.

(10) Patent No.: US 9,701,318 B2
(45) Date of Patent: Jul. 11, 2017

(54) VEHICULAR CONTROL DEVICE AND FAIL-SAFE METHOD

(71) Applicant: Hitachi Automotive Systems, Ltd., Hitachinaka-shi, Ibaraki (JP)

(72) Inventors: Hirotaka Amoh, Isesaki (JP); Toshiyuki Yamazaki, Isesaki (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 0 days.

(21) Appl. No.: 14/432,082

(22) PCT Filed: Sep. 29, 2014

(86) PCT No.: PCT/JP2014/075825
§ 371 (c)(1),
(2) Date: Mar. 27, 2015

(87) PCT Pub. No.: WO2015/068491
PCT Pub. Date: May 14, 2015

(65) Prior Publication Data
US 2015/0344039 A1 Dec. 3, 2015

(30) Foreign Application Priority Data

Nov. 8, 2013 (JP) .................................. 2013-232132

(51) Int. Cl.
*B60W 50/035* (2012.01)
*B60W 50/02* (2012.01)
(Continued)

(52) U.S. Cl.
CPC ...... *B60W 50/0225* (2013.01); *B60W 50/035* (2013.01); *H01L 23/62* (2013.01);
(Continued)

(58) Field of Classification Search
CPC ........ B60L 3/04; B60R 21/01; B60H 1/00814
(Continued)

(56) References Cited

U.S. PATENT DOCUMENTS 5,338,062 A * 8/1994 Kiuchi ................ B60R 21/0132
180/274
6,018,980 A * 2/2000 Kimura ................ B60R 21/013
73/12.04
(Continued)

FOREIGN PATENT DOCUMENTS

JP 2005-335607 12/2005
JP 2010-049367 3/2010
(Continued)

*Primary Examiner* — Thomas G Black
*Assistant Examiner* — Wae Louie
(74) *Attorney, Agent, or Firm* — Foley & Lardner LLP

(57) ABSTRACT

The present invention relates to a vehicular control device and to a fail-safe method. The control device includes: a circuit that monitors an operation of a processor 11a in a main control unit 11; and a circuit that monitors a supply voltage Vcc of processor 11a. When processor 11a is in a normal operation state but the supply voltage Vcc abnormally increases, a part of control functions that operative sub-control units 12, 13, 14, 15, . . . , fulfill are shut off in accordance with a control command from main control unit 11. This makes it possible to maintain the control function to the extent possible even when the supply voltage Vcc of processor 11a abnormally increases while processor 11a operates normally.

15 Claims, 3 Drawing Sheets

(51) Int. Cl.
*H01L 23/62* (2006.01)
*B60W 50/00* (2006.01)
(52) U.S. Cl.
CPC ............... *B60W 2050/0006* (2013.01); *B60W 2050/0045* (2013.01); *B60W 2900/00* (2013.01); *H01L 2924/0002* (2013.01)
(58) Field of Classification Search
USPC ........ 701/36, 45, 31.4, 33.4; 180/274, 65.31
See application file for complete search history.

(56) References Cited

U.S. PATENT DOCUMENTS

| | | | | |
|---|---|---|---|---|
| 7,281,599 | B2* | 10/2007 | Takeuchi | B60R 21/0132 |
| | | | | 180/274 |
| 7,363,997 | B2* | 4/2008 | Sato | B60K 1/04 |
| | | | | 180/282 |
| 7,556,119 | B2* | 7/2009 | Takehara | B60R 21/0136 |
| | | | | 180/274 |
| 8,892,312 | B2* | 11/2014 | Inagaki | B60L 3/04 |
| | | | | 180/274 |
| 2003/0169163 | A1* | 9/2003 | Robinson | B60R 22/48 |
| | | | | 340/457.1 |
| 2005/0267659 | A1* | 12/2005 | Sunaga | B60H 1/00814 |
| | | | | 701/36 |
| 2008/0046148 | A1* | 2/2008 | Hayashi | B60R 21/0136 |
| | | | | 701/45 |
| 2008/0167161 | A1* | 7/2008 | Mitchell | B60W 10/11 |
| | | | | 477/94 |
| 2009/0139781 | A1* | 6/2009 | Straubel | B60L 11/1875 |
| | | | | 180/65.1 |
| 2011/0224869 | A1* | 9/2011 | Inagaki | B60L 3/04 |
| | | | | 701/33.4 |
| 2011/0231053 | A1* | 9/2011 | Kuramochi | H04L 12/40026 |
| | | | | 701/31.4 |
| 2013/0197757 | A1* | 8/2013 | Ellis | B62D 5/0463 |
| | | | | 701/41 |
| 2014/0062176 | A1* | 3/2014 | Nishida | B60T 8/4872 |
| | | | | 303/3 |
| 2014/0136014 | A1* | 5/2014 | Suzuki | B60W 30/02 |
| | | | | 701/1 |
| 2014/0214252 | A1* | 7/2014 | Koike | B60Q 5/008 |
| | | | | 701/22 |
| 2014/0375327 | A1* | 12/2014 | Sievers | B60R 16/03 |
| | | | | 324/503 |
| 2015/0344039 | A1* | 12/2015 | Amoh | B60W 50/035 |
| | | | | 701/1 |

FOREIGN PATENT DOCUMENTS

| | | |
|---|---|---|
| JP | 2010-244311 | 10/2010 |
| JP | 2011-063231 A | 3/2011 |
| JP | 2011-189918 | 9/2011 |
| JP | 2013-018343 | 1/2013 |
| JP | 2013-180599 A | 9/2013 |

* cited by examiner

FIG. 2

| DETECTION OF ABNORMAL VOLTAGE | | FAIL-SAFE PROCESS |
|---|---|---|
| FIRST ECU | SECOND ECU | |
| NOT DETECTED | NOT DETECTED | ·NORMAL OPERATION |
| | DETECTED | ·SHUT OFF FUNCTIONS OTHER THAN WARNING-RELATED FUNCTION.<br>·MAINTAIN OPERATION OF WARNING-RELATED FUNCTION. |
| DETECTED | NOT DETECTED | ·SHUT OFF RUNNING-RELATED AND FUNCTIONAL SAFETY-RELATED FUNCTIONS.<br>·MAINTAIN OPERATIONS OF WARNING-RELATED AND SAFETY-RELATED FUNCTIONS.<br>·NOTIFY FAILURE OF SECOND ECU. |
| | DETECTED | ·SHUT OFF RUNNING-RELATED AND FUNCTIONAL SAFETY-RELATED FUNCTIONS.<br>·MAINTAIN OPERATIONS OF WARNING-RELATED AND SAFETY-RELATED FUNCTIONS. |

FIG. 3

| DETECTION OF ABNORMAL VOLTAGE | | FAIL-SAFE PROCESS |
| --- | --- | --- |
| FIRST ECU | SECOND ECU | |
| NOT DETECTED | NOT DETECTED | ·NORMAL OPERATION |
| | DETECTED | ·SHUT OFF ALL FUNCTIONS. |
| DETECTED | NOT DETECTED | ·SHUT OFF RUNNING-RELATED, SAFETY-RELATED AND FUNCTIONAL SAFETY-RELATED FUNCTIONS.<br>·MAINTAIN OPERATION OF WARNING-RELATED FUNCTION.<br>·NOTIFY FAILURE OF SECOND ECU. |
| | DETECTED | ·SHUT OFF RUNNING-RELATED, SAFETY-RELATED AND FUNCTIONAL SAFETY-RELATED FUNCTIONS.<br>·MAINTAIN OPERATION OF WARNING-RELATED FUNCTION. |

VEHICULAR CONTROL DEVICE AND FAIL-SAFE METHOD

TECHNICAL FIELD

The present invention relates to a vehicular control device and to a fail-safe method, and more specifically, to a control technique for a case in which the supply voltage of a processor falls outside a proper range.

BACKGROUND ART

Patent Document 1 discloses a vehicular electronic control device that monitors the supply voltage of a microcomputer. If a decrease in output voltage is detected, this vehicular electronic control device maintains the microcomputer in a reset state and simultaneously prohibits on-board loads from being driven.

REFERENCE DOCUMENT LIST

Patent Document

Patent Document 1: Japanese Patent Application Laid-open Publication No. 2013-018343

SUMMARY OF THE INVENTION

Problems to be Solved by the Invention

In order to improve their safety, some vehicles are equipped with an advanced driver assistance system (ADAS) that has a lane departure warning function, an automatic braking function and other safety-related functions.

An exemplary ADAS includes a main control unit and a plurality of sub-control units; the main control unit outputs control commands, and the sub-control units individually provide lane departure warning, automatic braking, and the like, in accordance with the control commands from the main control unit.

In terms of functional safety, such an ADAS desirably detects both an abnormal decrease and increase in supply voltage of a processor and then performs a fail-safe process. For example, if the ADAS performs a process of halting the operation of the processor whenever an abnormality occurs in the supply voltage, however, all the functions of the ADAS may be shut off.

In this case, if a driver who is accustomed to the control functions of the ADAS continues to drive without being aware of the shut-off of the ADAS functions or without sufficient knowledge about an influence of the shut-off of the ADAS functions, there are cases in which the change in the controllability makes the driver feel that there is something wrong.

The present invention, which has been conceived of in light of these problems, aims to provide a vehicular control device and a fail-safe method that are capable of maintaining a control function to the extent possible when an abnormality occurs in the supply voltage of a processor.

Means for Solving the Problems

In order to achieve the above aim, a vehicular control device according to the invention of this application includes a main control unit and a plurality of sub-control units; the main control unit outputs control commands, and the sub-control units control controlled objects in accordance with the control commands. The vehicular control device includes: a first monitoring circuit that monitors an operation of a processor in the main control unit; and a second monitoring circuit that monitors a supply voltage of the processor in the main control unit. When the first monitoring circuit detects that the processor operates normally but the second monitoring circuit detects that the supply voltage falls outside a proper range, a part of control functions that the plurality of sub-control units fulfill is shut off.

A fail-safe method according to the invention of this application is a fail-safe method for a vehicular control device that includes a main control unit and a plurality of sub-control units; the main control unit outputs control commands, and the sub-control units control controlled objects in accordance with the control commands. The fail-safe method includes the steps of: monitoring an operation of a processor in the main control unit; monitoring a supply voltage of the processor in the main control unit; and shutting off a part of control functions that the plurality of sub-control units fulfill when the processor operates normally but the supply voltage falls outside a proper range.

Effects of the Invention

According to the present invention described above, it is possible to ensure safety of a vehicle and simultaneously reduce a change in the controllability of the vehicle when the supply voltage of a processor varies.

BRIEF DESCRIPTION OF THE DRAWINGS

FIG. 2 is a view listing exemplary selection patterns in the embodiment of the present invention, which are used to select control functions to be shut off when the supply voltage enters an abnormal state.

FIG. 3 is a view listing exemplary selection patterns in the embodiment of the present invention, which are used to select control functions to be shut off when the supply voltage enters an abnormal state.

MODE FOR CARRYING OUT THE INVENTION

Figure 1:
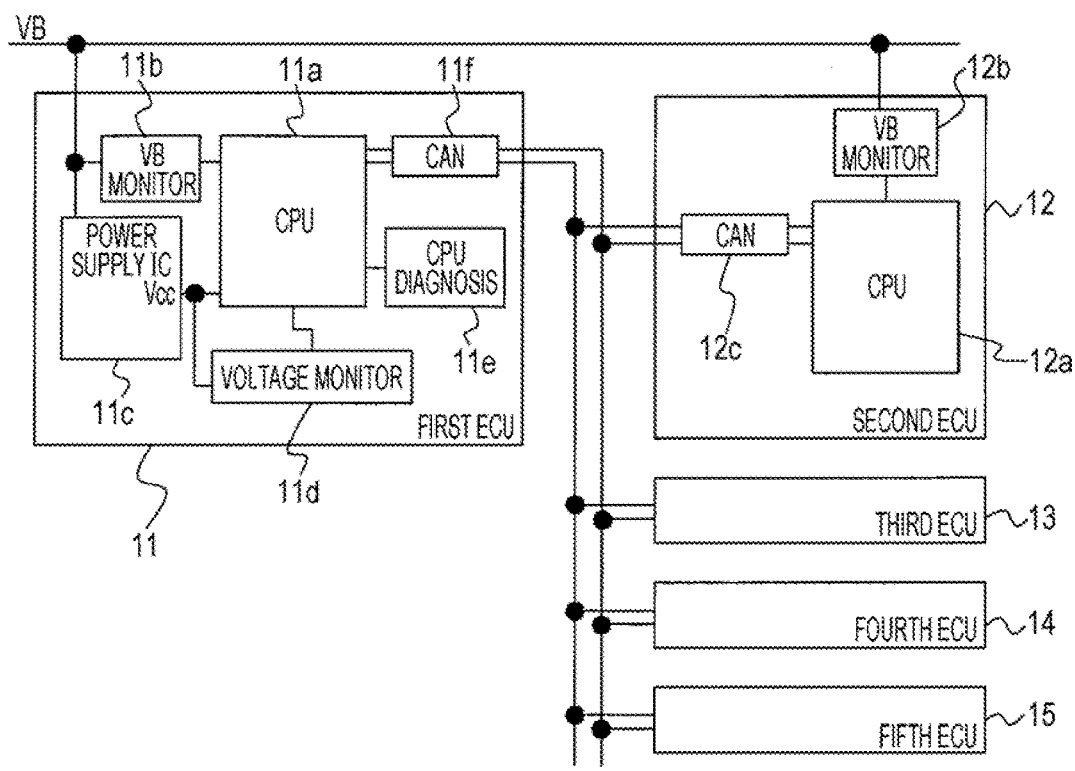
FIG. 1 is a block diagram illustrating a vehicular control system according to an embodiment of the present invention.

An embodiment of the present invention will be described below.

FIG. 1 is a view illustrating an exemplary configuration of a control system installed in a vehicle.

In the control system of FIG. 1, a plurality of electronic control units (ECUs) 11, 12, 13, 14, 15, . . . , are interconnected by a controller area network (CAN) in such a way that they can communicate with one another.

Of electronic control units 11, 12, 13, 14, 15, . . . , first electronic control unit 11 is a control unit in an advanced driver assistance system (ADAS).

Second electronic control unit 12, third electronic control unit 13, fourth electronic control unit 14, fifth electronic control unit 15, etc., are control units that control braking, an engine for producing driving power of the vehicle, a display device installed in the driver seat of the vehicle, a transmission, and the like.

First electronic control unit 11 in the ADAS includes a CPU (processor or microcomputer) 11a, a battery voltage monitoring circuit 11b, a power supply circuit 11c, a supply voltage monitoring circuit (second monitoring circuit) 11d, a CPU monitoring circuit (first monitoring circuit) 11e, a CAN communication circuit 11f, and the like.

Battery voltage monitoring circuit 11b outputs a result of monitoring a battery voltage VB to CPU 11a.

Power supply circuit 11c decreases the battery voltage VB to the rated supply voltage of CPU 11a and then outputs it as a supply voltage Vcc of CPU 11a.

An exemplary battery voltage VB is approximately 12V, an exemplary rated supply voltage of CPU 11a is approximately 5V.

Supply voltage monitoring circuit 11d monitors the supply voltage Vcc output from power supply circuit 11c, diagnosing whether or not an abnormality occurs in the supply voltage Vcc. Supply voltage monitoring circuit 11d diagnoses whether or not an abnormality in which the supply voltage Vcc becomes lower than a rated voltage occurs or whether or not an abnormality in which the supply voltage Vcc becomes higher than the rated voltage occurs. Then, supply voltage monitoring circuit 11d outputs the monitored result to both CPU 11a included in the same first electronic control unit 11 and second electronic control unit 12 that is an external electronic control unit.

In short, supply voltage monitoring circuit 11d detects whether or not the supply voltage Vcc falls outside a proper range and then outputs the detection result to both CPU 11a in first electronic control unit 11 and second electronic control unit 12. The proper range of the supply voltage Vcc refers to a preset voltage range within which the rated voltage falls.

When supply voltage monitoring circuit 11d detects that the supply voltage Vcc becomes abnormally low, it can perform a process of resetting CPU 11a, or outputs a reset signal to CPU 11a.

CPU monitoring circuit 11e is a circuit that monitors the operational state of CPU 11a, for example, on the basis of a program run signal output from CPU 11a. If an abnormality occurs in the operation of CPU 11a, CPU monitoring circuit 11e performs a process of resetting CPU 11a, or outputs a reset signal to CPU 11a.

CAN communication circuit 11f is a circuit that communicates with other electronic control units via the CAN.

Second electronic control unit 12 includes a CPU 12a, a battery voltage monitoring circuit 12b, a CAN communication circuit 12c, and the like. CPU 12a in second electronic control unit 12 receives an abnormality diagnosis signal of the supply voltage Vcc from supply voltage monitoring circuit 11d in first electronic control unit 11.

When each of second electronic control unit 12, third electronic control unit 13, fourth electronic control unit 14, fifth electronic control unit 15, etc., receives a control command for the ADAS from first electronic control unit 11, it outputs an operation signal to a corresponding controlled object.

First electronic control unit 11 serves as a main control unit that outputs a control command; each of second electronic control unit 12, third electronic control unit 13, fourth electronic control unit 14, fifth electronic control unit 15, etc., serves as a sub-control unit that controls a corresponding controlled object in accordance with a control command from first electronic control unit 11.

Exemplary functional types of the ADAS can be running-related, warning-related, safety-related and functional safety-related ones.

An exemplary running-related function of the ADAS in this example includes: a constant running speed/inter-vehicular distance control (adaptive cruise control) ACC that automatically controls the vehicle speed and the distance to a vehicle running in the front; and a vehicle dynamics control VDC that reduces lateral slip of the vehicle by controlling the braking and driving power.

An exemplary warning-related function of the ADAS in this example includes: a forward collision warning FCW that warns the driver by using a display or sound when there is a risk that the vehicle will collide with a vehicle running in the front; and a lane departure warning LDW that warns the driver by using a display or sound when the vehicle deviates from a lane.

An exemplary safety-related function of the ADAS in this example includes: side collision prevention (SCP) that gives a warning by using a display or sound and generates a yaw moment in such a way that the vehicle does not move toward the vehicle on the adjacent lane when the driver starts changing the lane toward an adjacent vehicle; and backup collision prevention (BCP) that operates a brake when it detects another vehicle in the rear while moving backward.

An exemplary functional safety-related function of the ADAS in this example includes collision prevention braking (forward collision avoidance assist) FCA that automatically operates the brake when there is a risk that the vehicle will collide with another vehicle or the like in the front.

In order to fulfil the above functions of the ADAS, first electronic control unit 11 outputs control commands regarding braking, driving power, and the like, to second electronic control unit 12, third electronic control unit 13, fourth electronic control unit 14, fifth electronic control unit 15, etc.

The functions of the ADAS are not limited to those described above; alternatively, various known drive assist functions may be used as appropriate. In addition, the configuration of the ADAS does not necessarily have to be equipped with all of the running-related, warning-related, safety-related and functional safety-related functions.

In the vehicular control system configured above, if the supply voltage Vcc of CPU 11a in first electronic control unit 11 abnormally increases, but CPU 11a in first electronic control unit 11 normally operates, first electronic control unit 11 performs a fail-safe process by maintaining at least a part of the functions of the ADAS and shutting off the other function or functions.

In this way, when the supply voltage Vcc of CPU 11a in first electronic control unit 11 abnormally increases, it is possible to prevent first electronic control unit 11 from erroneously controlling the vehicle and to maintain the ADAS functions to the extent possible, thereby reducing a change in the controllability of the vehicle.

A signal that indicates whether the supply voltage Vcc abnormally increases or not is output from supply voltage monitoring circuit 11d to both CPU 11a in first electronic control unit 11 and CPU 12a in second electronic control unit 12. In response, second electronic control unit 12 outputs a signal that indicates whether to detect an abnormal increase in supply voltage Vcc to first electronic control unit 11 via the CAN.

When CPU 11a operates normally but at least one of CPU 11a in first electronic control unit 11 and CPU 12a in second electronic control unit 12 detects an abnormal increase in supply voltage Vcc, first electronic control unit 11 performs the fail-safe process through which a part of the ADAS functions is shut off.

The plurality of electronic control units 11, 12, 13, 14, 15, . . . , interconnected via the CAN each have a function of diagnosing whether an abnormality occurs in the other electronic control units on the basis of signals transmitted from the other electronic control units via the CAN. Furthermore, each of electronic control units 11, 12, 13, 14, 15, . . . , has functions of: switching its control operation to a fail-safe mode on the basis of the received diagnosis result; transmitting the diagnosis result to another electronic control unit; or switching its control operation to a fail-safe mode on the basis of the diagnosis result from another electronic control unit.

A monitoring circuit that diagnoses an abnormality of the supply voltage Vcc of CPU 11a in first electronic control unit 11 may be installed in an electronic control unit other than first electronic control unit 11 or installed independent of the electronic control units as a single unit.

FIG. 2 lists exemplary selection patterns used to discriminate between ADAS functions to be shut off and maintained if CPU 11a in first electronic control unit 11 operates normally but the supply voltage Vcc of CPU 11a is diagnosed as being abnormal (in particular, the supply voltage Vcc becomes abnormally high).

A pattern 1 corresponds to a case in which neither first electronic control unit 11 nor second electronic control unit 12 detects a state in which the supply voltage Vcc of CPU 11a is abnormally high.

In this case, CPU 11a operates normally and the supply voltage Vcc is also normal. This means that first electronic control unit 11 can properly output a control command for performing the ADAS functions. Therefore, a process of shutting off each ADAS function is unnecessary.

In the event of the pattern 1, first electronic control unit 11 outputs a control command for performing the ADAS functions as usual.

A pattern 2 corresponds to a case in which second electronic control unit 12 detects a state in which the supply voltage Vcc of CPU 11a in first electronic control unit 11 is abnormally high but first electronic control unit 11 does not detect a state in which the supply voltage Vcc of CPU 11a therein is abnormally high.

In this case, there is a possibility that the supply voltage Vcc is actually in a state of being abnormally high but CPU 11a in first electronic control unit 11 fails to recognize this abnormality. Accordingly, even if the self-diagnosis result of CPU 11a indicates normality, first electronic control unit 11 may output a false control command.

In the event of the pattern 2, first electronic control unit 11 shuts off the running-related, safety-related and functional safety-related functions, which are ADAS functions to automatically change the running of the vehicle by automatically controlling the braking power and driving torque of the vehicle. However, first electronic control unit 11 maintains the warning-related function to warn the driver but does not change the running of the vehicle directly.

The shutting-off of the ADAS functions includes: stopping first electronic control unit 11 from outputting a control command; and stopping electronic control units 12, 13, 14, 15, . . . , from outputting operational amounts on the basis of a control command from first electronic control unit 11. In short, a process of shutting off the ADAS functions is a process that involves the halt of the operation of an actuator which is based on the ADAS functions.

Consequently, even when first electronic control unit 11 sets a false control command, it is possible to prevent the vehicle from running under false automatic control. In addition, all the ADAS functions are not shut off. In other words, the warning-related function is maintained. This can reduce a change in the controllability in comparison with a case of shutting off all the ADAS functions.

If the supply voltage Vcc enters an abnormally low state, CPU 11a is reset whereby all the ADAS functions are shut off. If a configuration in which CPU 11a is reset when the supply voltage Vcc enters an abnormally high state is employed, all the ADAS functions may also be shut off.

However, CPU 11a operates unstably when the supply voltage Vcc Is lower than the rated voltage, whereas it maintains normal operation to some extent when the supply voltage Vcc is higher than the rated voltage.

Moreover, when a driver who is accustomed to ADAS control functions continues to drive without being aware of the shut-off of the ADAS functions or without sufficient knowledge about effects of the shut-off of the ADAS functions, there are cases in which a change in the controllability of the vehicle makes the driver feel that there is something wrong.

In light of the above, when the supply voltage Vcc abnormally increases but first electronic control unit 11 (CPU 11a) still operates normally, some ADAS functions that do not exert a relatively large influence on the controllability in the unstable operational state are maintained. Consequently, it is possible to reduce a change in the controllability.

When the running-related, safety-related and functional safety-related functions are shut off in the event of the pattern 2, first electronic control unit 11 can warn the vehicle driver by using sound and a display that a part of the ADAS functions, that is, running-related, safety-related and functional safety-related functions, are shut off.

A pattern 3 corresponds to a case in which first electronic control unit 11 detects a state in which the supply voltage Vcc of CPU 11a is in an abnormally high state but second electronic control unit 12 does not detect a state in which the supply voltage Vcc of CPU 11a in first electronic control unit 11 is in an abnormally high state.

In this case, even if CPU monitoring circuit 11e diagnoses CPU 11a as being normal, the abnormally high supply voltage Vcc may cause first electronic control unit 11 to output a false control command.

However, assuming that the supply voltage Vcc is actually in the abnormally high state, first electronic control unit 11 can recognize the abnormality correctly. Thus, first electronic control unit 11 operates more reliably than that in the event of the pattern 2 in which it fails to recognize the abnormal voltage.

In the event of the pattern 3, accordingly, first electronic control unit 11 shuts off the running-related and functional safety-related functions but maintains the warning-related and safety-related functions.

If the running-related and functional safety-related functions are performed in accordance with a false control command, for example, a distance to a vehicle running in the front may be changed improperly. In contrast, if the warning-related function is performed in accordance with a false control command, the running vehicle is not affected directly; if the safety-related function is performed in accordance with a false control command, the running vehicle is led to the safe side.

As described above, CPU 11a in first electronic control unit 11 is more likely to output a proper control command in the event of the pattern 3 than the pattern 2. Therefore, in the event of the pattern 3, a larger number of ADAS functions are maintained, which reduces a change in the controllability upon the abnormal increase in supply voltage Vcc. In addition, setting the warning-related and safety-related functions such that they are maintained can prevent an unstable operation of first electronic control unit 11 from affecting safety of the vehicle.

In the event of the pattern 3, there is a possibility that the supply voltage Vcc actually abnormally increases but second electronic control unit 12 fails to recognize this voltage abnormality correctly. In this case, second electronic control unit 12 may malfunction.

In the event of the pattern 3, accordingly, first electronic control unit 11 outputs a signal to the third electronic control unit 13, the fourth electronic control unit 14, the fifth electronic control unit 15, etc., indicating that an abnormality occurs in second electronic control unit 12. This signal halts the operations of third electronic control unit 13, fourth electronic control unit 14, fifth electronic control unit 15, etc., which respond to a signal from second electronic control unit 12.

In the event of the pattern 3, in addition to the process of outputting the signal to the other electronic control units. Indicating that an abnormality occurs in second electronic control unit 12, or instead of the process of outputting the signal indicating the occurrence of the abnormality, for example, first electronic control unit 11 can perform a process of turning off a power supply relay in an actuator controlled by second electronic control unit 12.

A pattern 4 corresponds to a case in which both first electronic control unit 11 and second electronic control unit 12 detect a state in which the supply voltage Vcc of CPU 11a is abnormally high.

In this case, similar to the pattern 3, even if the diagnosis result of CPU 11a which is provided by CPU monitoring circuit 11e indicates normality, first electronic control unit 11 may output a false control command due to the abnormal voltage. Therefore, the running-related and functional safety-related functions are shut off but the warning-related and the safety-related functions are maintained.

However, since second electronic control unit 12 also detects the abnormal increase in supply voltage Vcc, second electronic control unit 12 would operate normally. As opposed to the pattern 3, therefore, first electronic control unit 11 does not perform the process of outputting a signal indicating that an abnormality occurs in second electronic control unit 12.

Selection patterns used to discriminate between the ADAS functions to be shut off and maintained when the supply voltage Vcc abnormally increases are not limited to the exemplary patterns in FIG. 2; they may be set as appropriate in consideration of safety, controllability and other factors of a vehicle.

FIG. 3 illustrates other exemplary selection patterns in which when a voltage abnormality occurs, a small or limited number of ADAS functions are maintained in comparison with the selection patterns listed in FIG. 2.

In the event of a patter 1, which is one of the selection patterns listed in FIG. 3, in which neither first electronic control unit 11 nor second electronic control unit 12 detects a voltage abnormality, first electronic control unit 11 performs all the ADAS functions as usual, similar to the selection patterns of FIG. 2.

In the event of a pattern 2 in which second electronic control unit 12 detects an abnormal increase in supply voltage Vcc of CPU 11a in first electronic control unit 11 but first electronic control unit 11 does not detect an abnormal increase in supply voltage Vcc of CPU 11a, all the ADAS functions, including the warning-related function, are shut off as in the example of FIG. 3, although the warning-related function is maintained in the example of FIG. 2. This prevents the ADAS functions including a warning operation from being performed falsely.

In the event of patterns 3 and 4 in which first electronic control unit 11 detects an abnormality of the supply voltage Vcc of CPU 11a, only the warning-related function is maintained and the running-related, safety-related and functional safety-related functions are shut off as in the example of FIG. 3, although the configuration in which the warning-related and safety-related functions are maintained is employed in the example of FIG. 2.

As described above, when the supply voltage Vcc abnormally increases but CPU 11a in first electronic control unit 11 operates normally, the warning-related function is maintained. Fulfilling the warning-related function contributes to the safety of the vehicle.

The specific contents of the present invention have been described with reference to the preferred embodiment; however, it is obvious that one skilled in the art can employ various modifications on the basis of a primary technical spirit and teaching of the present invention.

For example, first electronic control unit 11 is not limited to a control unit for ADAS; alternatively, first electronic control unit 11 that has a plurality of control functions may be configured to maintain one or more of multiple types of control functions and shut off the remaining functions if the supply voltage Vcc of CPU 11a abnormally increases.

In this case, the functions to be maintained are functions that do not exert a relatively large influence on the safety of the vehicle even when the CPU operates unstably, whereas the functions to be shut off are functions that may exert a relatively large influence on the safety of the vehicle due to unstable operation of the CPU.

The configuration in which both first electronic control unit 11 and second electronic control unit 12 monitor the supply voltage Vcc of CPU 11a in first electronic control unit 11 is not limiting. Alternatively, a configuration in which one of first electronic control unit 11 and another electronic control unit monitors the supply voltage Vcc may be employed.

The configuration in which ADAS functions to be maintained or shut off are selected from four functions, that is, the running-related, safety-related, functional safety-related and warning-related functions, but this is not limited thereto. Alternatively, for example, functions to be maintained or shut off may be selected from a plurality of functions included in the warning-related and safety-related functions.

REFERENCE SYMBOL LIST

11 First electronic control unit (main control unit)
11a CPU (processor)
11b Battery voltage monitoring circuit
11c Power supply circuit
11d Supply voltage monitoring circuit (second monitoring circuit)
11e CPU monitoring circuit (first monitoring circuit)
11f CAN communication circuit
12 Second electronic control unit (sub-control unit)

The invention claimed is:

1. A vehicular control device including a main control unit and a plurality of sub-control units, the main control unit outputting control commands, the sub-control units controlling controlled objects in accordance with the control commands, the vehicular control device comprising:
a first monitoring circuit that monitors an operation of a processor in the main control unit; and
a second monitoring circuit that monitors a supply voltage of the processor in the main control unit, wherein when the first monitoring circuit detects that the processor operates normally but the second monitoring circuit detects that the supply voltage falls outside a proper range, a part of control functions that the plurality of sub-control units fulfill are shut off.

2. The vehicular control device according to claim 1, wherein
the main control unit shuts off the part of the control functions that the plurality of sub-control units fulfill by using the control commands output to the plurality of sub-control units.

3. The vehicular control device according to claim 1, wherein
the shut-off of the part of the control functions is shut-off of control functions that one or more sub-control units out of the plurality of sub-control units fulfill.

4. The vehicular control device according to claim 3, wherein
the main control unit discriminates between sub-control units, control functions of which are shut off, and sub-control units, control functions of which are maintained, on the basis of types of the control functions that the plurality of sub-control units fulfill.

5. The vehicular control device according to claim 1, wherein
when the first monitoring circuit detects that the processor operates normally but the second monitoring circuit detects that the supply voltage falls outside the proper range on a higher voltage side, the part of the control functions that the plurality of sub-control units fulfill is shut off.

6. The vehicular control device according to claim 1, wherein
the second monitoring circuits are individually installed in the main control unit and at least one of the plurality of sub-control units.

7. The vehicular control device according to claim 1, wherein
the shut-off part of the control functions that the plurality of sub-control units fulfill is changed on the basis of a combination of a monitoring result provided by the second monitoring circuit installed in the main control unit and a monitoring result provided by the second monitoring circuit installed in the sub-control unit.

8. The vehicular control device according to claim 7, wherein
when the second monitoring circuit installed in the main control unit detects that the supply voltage falls within the proper range but the second monitoring circuit installed in the at least one of the plurality of sub-control units detects that the supply voltage falls outside the proper range, a larger number of control functions out of the control functions of the plurality of sub-control units are shut off than when the second monitoring circuit installed in the main control unit detects that the supply voltage falls outside the proper range but the second monitoring circuit installed in the at least one of the plurality of sub-control units detects that the supply voltage falls within the proper range.

9. The vehicular control device according to claim 6, wherein
when the second monitoring circuit installed in the main control unit detects that the supply voltage falls outside the proper range but the second monitoring circuit installed in the at least one of the plurality of sub-control units detects that the supply voltage falls within the proper range, the main control unit outputs a signal to the sub-control units that are not provided with the second monitoring circuit, the signal indicating that an abnormality occurs in the sub-control unit provided with the second monitoring circuit.

10. The vehicular control device according to claim 1, wherein
the main control unit and the plurality of sub-control units constitute a vehicular drive assist system, and at least one of the sub-control units has a function of issuing an alarm to a driver, and
when the first monitoring circuit detects that the processor operates normally but the second monitoring circuit detects that the supply voltage falls outside the proper range on a higher voltage side, a warming function out of the control functions that the plurality of sub-control units fulfill is maintained but the other control functions are shut off.

11. The vehicular control device according to claim 6, wherein
when the supply voltage falls outside the proper range on a lower voltage side, the second monitoring circuit installed in the main control unit resets the processor.

12. A fail-safe method for a vehicular control device, the vehicular control device including a main control unit and a plurality of sub-control units, the main control unit outputting control commands, the sub-control units controlling controlled objects in accordance with the control commands, the fail-safe method comprising the steps of:
monitoring an operation of a processor in the main control unit;
monitoring a supply voltage of the processor in the main control unit; and
shutting off a part of control functions that the plurality of sub-control units fulfill when the processor operates normally but the supply voltage falls outside a proper range.

13. The fail-safe method for the vehicular control device according to claim 12, wherein
the step of shutting off the part of the control functions includes shutting off the part of the control functions that the plurality of sub-control units fulfill when the processor operates normally but the supply voltage falls outside the proper range on a higher voltage side.

14. The fail-safe method for the vehicular control device according to claim 12, wherein
the step of monitoring the supply voltage includes the steps of monitoring the supply voltage by using the main control unit; and monitoring the supply voltage by using at least one of the plurality of sub-control units, and
the step of shutting off the part of the control functions includes the step of changing the shut-off part of the control functions out of the control functions that the plurality of sub-control units fulfill, on the basis of a combination of a monitoring result of the supply voltage which is provided by the main control unit and a monitoring result of the supply voltage which is provided by the sub-control unit.

15. The fail-safe method for the vehicular control device according to claim 14, wherein
the step of changing the shut-off part of the control functions includes shutting off a larger number of control functions when the main control unit detects that the supply voltage falls within the proper range but the sub-control unit detects that the supply voltage falls outside the proper range than when the main control unit detects that the supply voltage falls outside the proper range but the sub-control unit detects that the supply voltage falls within the proper range.

* * * * *